(12) United States Patent
Chow et al.

(10) Patent No.: US 7,741,935 B2
(45) Date of Patent: Jun. 22, 2010

(54) HIGH VOLTAGE ISOLATION SEMICONDUCTOR CAPACITOR DIGITAL COMMUNICATION DEVICE AND CORRESPONDING PACKAGE

(75) Inventors: Fun Kok Chow, Singapore (SG); Gek Yong Ng, Singapore (SG); Kah Weng Lee, Singapore (SG)

(73) Assignee: Avago Technologies ECBU IP (Singapore) Pte. Ltd., Singapore (SG)

( * ) Notice: Subject to any disclaimer, the term of this patent is extended or adjusted under 35 U.S.C. 154(b) by 276 days.

(21) Appl. No.: 12/032,165

(22) Filed: Feb. 15, 2008

(65) Prior Publication Data

US 2009/0206958 A1    Aug. 20, 2009

(51) Int. Cl.
*H01P 1/00* (2006.01)
(52) U.S. Cl. .................................................... 333/247
(58) Field of Classification Search ................. 333/247; 29/825; 323/303
See application file for complete search history.

(56) References Cited

U.S. PATENT DOCUMENTS

| | | | |
|---|---|---|---|
| 4,799,092 A | 1/1989 | Klaassen | |
| 4,989,127 A | 1/1991 | Wegener | |
| 5,530,277 A | 6/1996 | Otsuki et al. | |
| 5,561,393 A | 10/1996 | Sakurai et al. | |
| 5,625,265 A | 4/1997 | Vlahu | |
| 5,693,971 A * | 12/1997 | Gonzalez | 257/314 |
| 5,945,728 A | 8/1999 | Dobkin et al. | |
| 6,137,827 A | 10/2000 | Scott | |
| 6,167,475 A * | 12/2000 | Carr | 710/113 |
| 6,215,377 B1 | 4/2001 | Douriet et al. | |
| 6,320,532 B1 * | 11/2001 | Diede | 342/124 |
| 7,136,274 B2 | 11/2001 | Diede | |
| 6,489,850 B2 * | 12/2002 | Heineke et al. | 330/307 |
| 6,538,313 B1 * | 3/2003 | Smith | 257/684 |
| 6,563,211 B2 | 5/2003 | Fukada et al. | |
| 6,574,091 B2 * | 6/2003 | Heineke et al. | 361/328 |
| 6,583,681 B1 | 6/2003 | Makino et al. | |
| 6,583,976 B1 | 6/2003 | Murahashi et al. | |
| 6,661,079 B1 * | 12/2003 | Bikulcius | 257/532 |

(Continued)

FOREIGN PATENT DOCUMENTS

WO    WO 2005/001928    6/2005

(Continued)

OTHER PUBLICATIONS

U.S. Appl. No. 11/264,956, filed Nov. 1, 2005, Guenin et al.

(Continued)

*Primary Examiner*—Adolf Berhane
*Assistant Examiner*—Yemane Mehari

(57) ABSTRACT

According to one embodiment, there is provided a semiconductor digital communication device comprising communication drive and sense electrodes formed in a single plane, where the electrodes have relatively high sidewalls. The relatively high sidewalls permit low electrical field densities to be obtained in the sense and drive electrodes during operation, and further permit very high breakdown voltages to be obtained between the electrodes, and between the drive electrode and an underlying ground plane substrate. The device effects communications between drive and receive circuits through the drive and sense electrodes by capacitive means, and in a preferred embodiment is capable of effecting relatively high-speed digital communications. The device may be formed in a small package using, by way of example, CMOS or other semiconductor fabrication and packaging processes.

33 Claims, 6 Drawing Sheets

U.S. PATENT DOCUMENTS

| | | | |
|---|---|---|---|
| 6,944,009 B2* | 9/2005 | Nguyen et al. | 361/328 |
| 6,960,945 B1 | 11/2005 | Bonin | |
| 7,016,490 B2 | 3/2006 | Beutler et al. | |
| 7,170,807 B2 | 1/2007 | Franzen et al. | |
| 7,331,723 B2* | 2/2008 | Yoon et al. | 385/92 |
| 7,379,037 B2 | 5/2008 | Takeuchi et al. | |
| 7,394,337 B2* | 7/2008 | Arai et al. | 333/260 |
| 2006/0095639 A1* | 5/2006 | Guenin et al. | 710/310 |
| 2007/0008679 A1 | 1/2007 | Takahasi et al. | |
| 2007/0025123 A1 | 2/2007 | Kim et al. | |
| 2007/0133933 A1 | 6/2007 | Yoon et al. | |
| 2007/0162645 A1* | 7/2007 | Han et al. | 710/22 |
| 2008/0179963 A1 | 7/2008 | Fouquet et al. | |

FOREIGN PATENT DOCUMENTS

| | | |
|---|---|---|
| WO | WO-2005/001928 | 6/2005 |

OTHER PUBLICATIONS

ACCL-9xxx 3.3V/5V High Speed CMOS Capacitive Isolator, Preliminary Datasheet, Avago Technologies, Date unknown.

Texas Instruments Dual Digital Isolators, SLLS755E, Jul. 2007.

* cited by examiner

HIGH VOLTAGE ISOLATION SEMICONDUCTOR CAPACITOR DIGITAL COMMUNICATION DEVICE AND CORRESPONDING PACKAGE

FIELD OF THE INVENTION

Various embodiments of the invention described herein relate to the field of digital communications, and more specifically to devices employing capacitively-coupled means to transmit and receive digital communication data at relatively high speeds in a small package exhibiting high breakdown voltage characteristics. The components, devices, systems and methods described herein find particularly efficacious use in high-speed communication applications requiring high voltage isolation.

BACKGROUND

High voltage isolation communication devices known in the prior art include optical devices, magnetic devices and capacitive devices. Prior art optical devices typically achieve high voltage isolation by employing LEDs and corresponding photodiodes to transmit and receive light signals, usually require high power levels, and suffer from operational and design constraints when multiple communication channels are required. Prior art magnetic devices typically achieve high voltage isolation by employing opposing inductively-coupled coils, also usually require high power levels (especially when high data rates required), typically require the use of at least three separate integrated circuits or chips, and are susceptible to electromagnetic interference ("EMI"). Prior art capacitive devices typically achieve high voltage isolation by employing multiple pairs of transmitting and receiving electrodes, where for example a first pair of electrodes is employed to transmit and receive data, and a second pair of electrodes is employed to refresh or maintain the transmitted signals.

What is needed is a high voltage isolation communication device that is small, consumes reduced power, permits data to be communicated at relatively high data rates, has improved high voltage breakdown capabilities, and that may be built at lower cost.

Further details concerning various aspects of some prior art devices and methods are set forth in U.S. Pat. No. 5,693,971 to Gonzales entitled "Combined trench and field isolation structure for semiconductor devices" dated Dec. 2, 1997; U.S. Pat. No. 6,167,475 to Carr entitled "Data transfer method/engine for pipelining shared memory bus accesses" dated Dec. 26, 2000; U.S. Pat. No. 6,215,377 to Douriet entitled "Low cost wideband RF port structure for microwave circuit packages using coplanar waveguide and BGA I/O format" dated Apr. 10, 2001; U.S. Pat. No. 6,320,532 to Diede entitled "Low power radar level transmitter having reduced ground loop errors" dated Nov. 20, 2001; U.S. Pat. No. 6,489,850 to Heineke et al. entitled "Crosstalk suppression in differential AC coupled multichannel IC amplifiers" dated Dec. 3, 2002; U.S. Pat. No. 6,538,313 to Smith entitled "IC package with integral substrate capacitor" dated Mar. 25, 2003; U.S. Pat. No. 6,574,091 to Heineke et al. entitled "Multi-plate capacitor structure" dated Jun. 3, 2003; U.S. Pat. No. 6,661,079 to Bikulcius entitled "Semiconductor-based spiral capacitor" dated Dec. 9, 2003; U.S. Pat. No. 6,944,009 to Nguyen et al. entitled "Ultra broadband capacitor assembly" dated Sep. 13, 2005; U.S. Pat. No. 7,170,807 to Fazan et al. entitled "Data storage device and refreshing method for use with such device" dated Jan. 30, 2007; U.S. Patent Publication No. 2007/0133,933 to Hoon entitled "Enhanced coplanar waveguide and optical communication module using the same" dated Jun. 14, 2007; U.S. Patent Publication No. 2007/0162645 to Han entitled "Communication system for data transfer between on-chip circuits" dated Jul. 12, 2007, U.S. patent application Ser. No. 11/264,956 to Guenin et al. entitled "Structures and methods for proximity communication using bridge chips" dated Nov. 1, 2005, and WO/2005/001928 to Hester et al. entitled "Capacitor-related systems for addressing package/motherboard resonance" dated Jun. 1, 2005. The foregoing patents and patent applications are hereby incorporated by reference herein, each in its respective entirety.

SUMMARY

In some embodiments, there is provided a high voltage isolation semiconductor digital communication device comprising at least one communication drive electrode comprising a drive input and opposing substantially vertical sidewalls having a height of about $T_n$, the drive electrode further being formed of a first electrically conductive metal, metal alloy or metal mixture, at least one communication sense electrode comprising a sense output and opposing substantially vertical sidewalls having a height of about $T_n$, the sense electrode being formed of a second electrically conductive metal, metal alloy or metal mixture, an electrically conductive ground plane substrate spaced apart from the drive and sense electrodes by an electrically insulative layer having a thickness d, a drive circuit operably coupled to the drive input and configured to transmit a communication drive signal therethrough, and a receive circuit operably coupled to the sense output and configured to receive the communication drive signal transmitted between the sense and drive electrodes. The drive and sense communication electrodes are disposed substantially in a single plane and are operably configured and associated in respect of one another to effect the transfer of digital communication signals therebetween by capacitive means.

In one embodiment, sidewall heights $T_n$ exceed about 1 micron thereby to decrease electrical field densities associated therewith, the sense and drive electrodes are separated by an inter-electrode spacing $T_d$ exceeding about 1 micron, the inter-electrode spacing is greater than or equal to the thickness d, and a first breakdown voltage between the drive electrode and the sense electrode exceeds about 2,000 volts RMS, about 2,500 volts RMS, or about 3,000 volts RMS when applied over a time period of about one minute. The first breakdown voltage may also be greater than or equal to a second breakdown voltage between the drive electrode and the ground plane substrate.

In other embodiments, there is provided a method of making a semiconductor digital communication device comprising providing at least one communication drive electrode comprising a drive input and opposing substantially vertical sidewalls having a height of about $T_n$, the drive electrode further being formed of a first electrically conductive metal, metal alloy or metal mixture, providing at least one communication sense electrode comprising a sense output and opposing substantially vertical sidewalls having a height of about $T_n$, the sense electrode being formed of a second electrically conductive metal, metal alloy or metal mixture, providing an electrically conductive ground plane substrate spaced apart from the drive and sense electrodes by an electrically insulative layer having a thickness d, providing a drive circuit operably coupled to the drive input and configured to transmit a communication drive signal therethrough, and providing a receive circuit operably coupled to the sense output and configured to receive the communication drive signal transmitted between the sense and drive electrodes.

Further embodiments are disclosed herein or will become apparent to those skilled in the art after having read and understood the specification and drawings hereof.

BRIEF DESCRIPTION OF THE DRAWINGS

Different aspects of the various embodiments of the invention will become apparent from the following specification, drawings and claims in which:

The drawings are not necessarily to scale. Like numbers refer to like parts or steps throughout the drawings, unless otherwise noted.

DETAILED DESCRIPTION OF SOME PREFERRED EMBODIMENTS

In the various embodiments of the invention, a mutual-capacitance system is provided having co-planar sense and drive electrodes disposed substantially in a single plane.

According to one embodiment, there is provided a semiconductor digital communication device comprising co-planar communication drive and sense electrodes formed in a single plane, where the electrodes have relatively high sidewalls. The relatively high sidewalls permit low electrical field densities to be obtained in the sense and drive electrodes during operation, and further permit very high breakdown voltages to be obtained between the electrodes, and between the drive electrode and an underlying ground plane substrate. The device effects communications between drive and receive circuits through the drive and sense electrodes by capacitive means, and in a preferred embodiment is capable of effecting relatively high-speed digital communications. The device may be formed in a small chip or package employing CMOS and other semiconductor fabrication and packaging processes.

Figure 1:
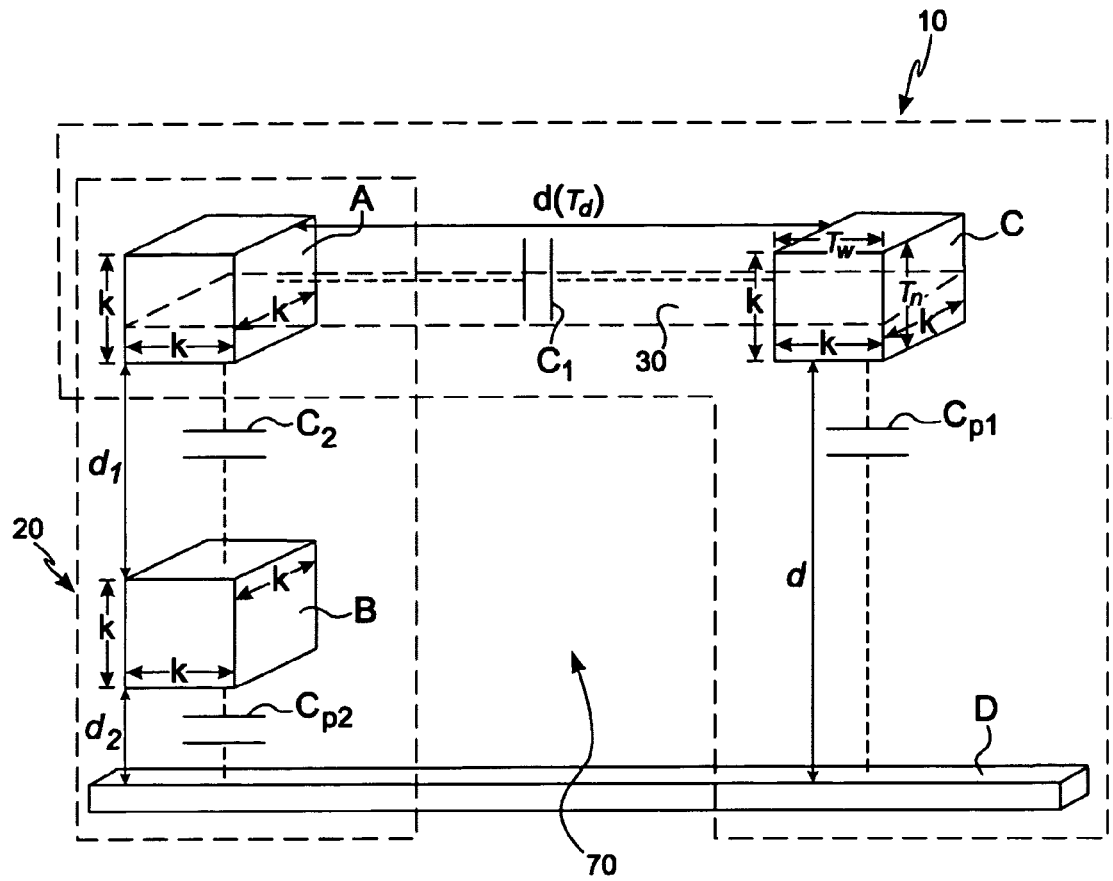
FIG. 1 shows horizontal and vertical capacitor structures.

FIG. 1 shows co-planar horizontal and stacked vertical capacitor structures 10 and 20, respectively. Co-planar horizontal capacitor structure 10 comprises electrodes A and C separated by distance d and characterized by capacitance $C_1$ therebetween, and electrode C and ground plane substrate D separated by distance d and characterized by parasitic capacitance $C_{p1}$. Vertical capacitor structure 20 comprises electrodes A and B separated by distance $d_1$ and characterized by capacitance $C_2$ therebetween, and electrode B and ground plane substrate D separated by distance $d_2$ and characterized by parasitic capacitance $C_{p2}$. As shown in FIG. 1, electrodes A, B and C have widths, heights and lengths all equaling k, which simplifies the derivation of equations 1 through 6 set forth below. Electrodes A and C are formed in an upper metal layer in horizontal capacitor structure 10, and electrode B is formed in a lower metal layer in vertical capacitor structure 20. In horizontal and vertical capacitor structures 10 and 20 illustrated in FIG. 1, it is assumed that capacitance arises from the surface areas presented by electrodes A, B and C only, and that fringe capacitance is zero.

In accordance with the foregoing assumptions, capacitances $C_1$ and $C_2$, parasitic capacitances $C_{p1}$ and $C_{p2}$, coupling efficiencies $C_{1\mathit{eff}}$ and $C_{2\mathit{eff}}$ may be calculated as follows:

$$C_1 = \epsilon k^2/d \qquad \text{eq. (1),}$$

$$C_{p1} = \epsilon k^2/d \qquad \text{eq. (2),}$$

$$C_{1\mathit{eff}} = C_1/(C_1 + C_{p1}) = \tfrac{1}{2} \qquad \text{eq. (3),}$$

$$C_2 = \epsilon k^2/d, \qquad \text{eq. (4),}$$

$$C_{p2} = \epsilon k^2/d_2 \qquad \text{eq. (5), and}$$

$$C_{2\mathit{eff}} = C_2/(C_2 + C_{p2}) = d_2/(d_1 + d_2) \qquad \text{eq. (6),}$$

where $\epsilon$=the permittivity of a dielectric material disposed between electrodes A, B and C, and between such electrodes and substrate D. Note that in capacitor structures 10 and 20 illustrated in FIG. 1, electrode A is a drive electrode, and electrodes B and C are sense electrodes.

Referring to equation 6 above, it will be seen that if $d_1=d_2$, then $C_{2\mathit{eff}}=\tfrac{1}{2}$, which is the same coupling efficiency provided by $C_{1\mathit{eff}}$. However, the breakdown voltage between electrode A and electrode B for $C_{2\mathit{eff}}$ is lower than the breakdown voltage between electrode A and electrode C for $C_{1\mathit{eff}}$, since $d_1$ is less than d.

Continuing to refer to equation 6 above, it will be seen that if $d_1 < d_2$, then $C_{2\mathit{eff}} > \tfrac{1}{2}$, which is an even greater coupling efficiency provided by $C_{1\mathit{eff}}$. However, the breakdown voltage between electrode A and electrode B for $C_{2\mathit{eff}}$ in this case is now even lower than the breakdown voltage between electrode A and electrode C for $C_{1\mathit{eff}}$, since $d_1$ is much less than d.

Still referring to equation 6 above, it will be seen that if $d_1 > d_2$, then $C_{2\mathit{eff}} < \tfrac{1}{2}$, which is lower than the coupling efficiency provided by $C_{1\mathit{eff}}$. While the breakdown voltage between electrode A and electrode B for $C_{2\mathit{eff}}$ is better than in the two cases described above, it is still lower than the breakdown voltage between electrode A and electrode C for $C_{1\mathit{eff}}$, since $d_1$ is less than d.

The above calculations illustrate that in a capacitor design for a high voltage isolation semiconductor digital communication device various tradeoffs must be made between coupling efficiency, parasitic capacitance, breakdown voltage, geometry and other factors. To that end, it has been discovered that horizontal capacitor structure 10 illustrated in FIG. 1, in comparison to vertical capacitor structure 20 of FIG. 1, provides the best overall performance characteristics in a device where high voltage isolation, high breakdown voltages and good coupling efficiencies are required. Moreover, in horizontal capacitor structure 10 of FIG. 1, if the thickness of electrodes A and C in the top metal layer of horizontal capacitor structure 10 is increased, coupling efficiency $C_{1\mathit{eff}}$ increases because as capacitance $C_1$ increases in response to the thickness of electrodes A and C being increased, parasitic capacitance $C_{p1}$ remains constant. As shown in FIG. 1, electrodes A and C are disposed in the same horizontal plane 30, and thus the breakdown voltage between electrodes A and C, or between electrode A and ground plane substrate D, is always greater than the breakdown voltage between electrode A and electrode B. Thus, in one embodiment of the high voltage isolation semiconductor communication device of the invention, where co-planar sense and drive electrodes are disposed in a single horizontally-oriented plane 30, coupling efficiency is improved while maintaining a high breakdown voltage. Such high coupling efficiency translates directly into improved circuit performance, smaller package or chip area, lower power consumption, and faster data transmission rates.

Figure 2:
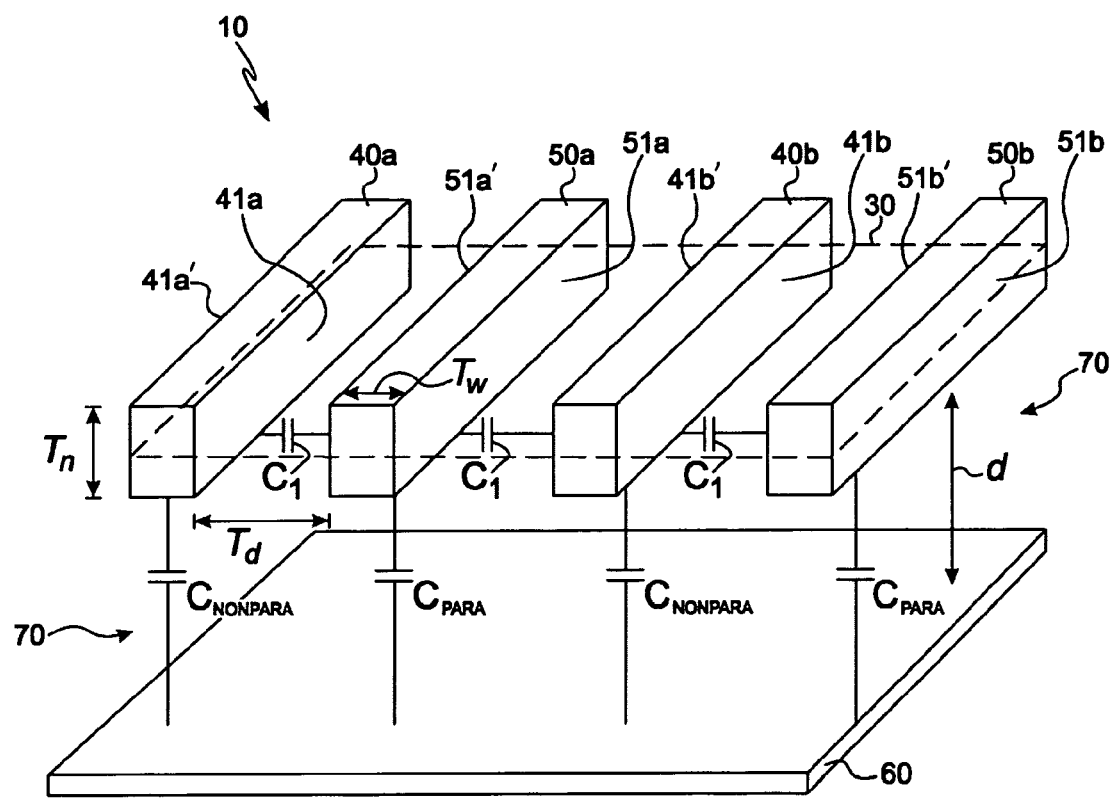
FIG. 2 shows a schematic embodiment of a high voltage isolation semiconductor communication device with co-planar drive and sense electrodes disposed in a single plane.

FIG. 2 shows a schematic embodiment of a high voltage isolation semiconductor communication device with communication drive electrodes 40a and 40b, and communication sense electrodes 50a and 50b disposed substantially in a single horizontal plane 30 positioned above ground plane substrate 60. As shown in FIG. 2, and as in respect of electrodes A and C in FIG. 1, electrodes 40a, 40b, 50a and 50b are co-planar respecting one another and are all disposed substantially within horizontal plane 30. The distance between ground plane substrate 60 and the underside of any of electrodes 40a, 40b, 50a and 50b is approximately equal to d, as further shown by referring to FIGS. 1 and 2. In a preferred embodiment, drive and sense electrodes 40a, 40b, 50a and 50b are separated from electrically conductive ground plane substrate 60 by an electrically insulative layer 70 of thickness d. As shown in FIG. 2, each of electrodes 40a, 40b, 50a, and 50b has opposing substantially vertical sidewalls 41a and 41a', 41b and 41b', 51a and 51a', and 51b and 51b', each such sidewall having a height $T_n$. Note that as sidewall height $T_n$ increases by a factor of x, the electric field density between drive and sense electrodes 40 and 50 may effectively be decreased by a factor of up to x, assuming that inter-electrode spacing $T_d$ remains constant. For example, with all other conditions being constant, if $T_n$ is increased from 1 micron to 3 microns, the electric field density between opposing drive and sense electrodes is reduced by a factor of 2 to 3. Because sidewall heights $T_n$ of drive and sense electrodes 40a, 40b, 50a and 50b are greater than about 1 micron, increased surface area is available on such sidewalls for the electrical field lines emanating therefrom or received thereon. Consequently, the invention has the advantage of providing drive and sense electrodes having reduced electrical field density, which increases the breakdown voltage. In one embodiment, the drive and sense electrodes have an electric field density not exceeding about 400 volts/micron when a voltage placed across the sense and drive electrode ranges between about 2,000 volts RMS and about 3,000 volts RMS.

A drive circuit (not shown in FIG. 2) is operably connected to a drive input of drive electrodes 40a and 40b, while a receive circuit is operably connected to a receive output of sense or receive electrodes 50a and 50b. The drive circuit is configured to transmit a communication drive signal through drive electrodes 40a and 40b, while the receive circuit is configured to receive the communication drive signal transmitted between drive electrodes 40a and 40b and sense electrodes 50a and 50b.

Continuing to refer to FIG. 2, it will be seen that drive and sense communication electrodes 40a, 40b, 50a and 50b are disposed substantially in single plane 30 and are operably configured and associated in respect of one another to effect the transfer of digital communication signals therebetween by capacitive means. In a preferred embodiment, electrode sidewall height $T_n$ exceeds about 1 micron, sense and drive electrodes 40a, 40b, 50a and 50b are separated by an inter-electrode spacing $T_d$ exceeding about 1 micron, and the inter-electrode spacing $T_d$ is greater than or equal to the thickness d. In some embodiments, inter-electrode spacing $T_d$ may be about 1.5 times greater or about 2.0 times greater than the thickness d of electrically insulative layer 70. The sidewall height $T_n$ may range between about 1 micron and about 6 microns, or between about 1 micron and about 3 microns. Inter-electrode spacing $T_d$ may also range between about 1 micron and about 15 microns.

A first breakdown voltage between communication drive electrode 40 and communication sense electrode 50 exceeds about 2,000 volts RMS when applied over a time period of about one minute, about 2,500 volts RMS when applied over a time period of about one minute, or about 3,000 volts RMS when applied over a time period of about one minute. The first breakdown voltage may also be greater than or equal to a second breakdown voltage between the drive electrode and the ground plane substrate. According to UL (UNDERWRITERS LABORATORIES™) Standard 1577, the primary test of a device's insulation performance or capability is the device's ability to withstand the application of high voltages without breaking down. In the test specified in UL 1577, a test is performed where a voltage (ac RMS or DC) is applied between the input and output terminals of a device for one minute. Withstand voltage ratings ranging between about 2,500 $V_{rms}$ and about 5,000 $V_{rms}$ are highly desirable under such test conditions.

Drive and sense electrodes 40a, 40b, 50a and 50b are preferably formed of an electrically conductive metal, a metal alloy or a metal mixture. The metals, metal alloys or metal mixtures employed to form drive and sense electrodes 40a, 40b, 50a and 50b may be the same, or may be different from one another, and may comprise any one or more of gold, silver, copper, tungsten, tin, aluminium, and aluminium-copper. In a preferred embodiment, drive electrodes 40a and 40b, and sense or receive electrodes 50a and 50b, are formed using CMOS metal deposition techniques well known to those skilled in the art, and inter-electrode spacing $T_d$ is provided by controllably etching away metal between adjoining electrodes using, for example, a high density plasma etching technique, and then filling the space defined by inter-electrode spacing $T_d$ with one or more of a semiconductor dielectric material, silicon oxide, silicon nitride, and/or a thick oxide. Care must be taken that voids in the semiconductor dielectric material are not formed, and that the metal layers are etched out anisotropically during the etching process. Well known High Density Plasma ("HDP"), Tetraethylorthosilicate ("TEOS"), and Plasma Enhanced Silicon Nitride ("PESN") passivation techniques may also be employed advantageously when fabricating structure 10.

Electrically insulative layer 70 may be formed using conventional CMOS techniques and materials such as one or more of a semiconductor dielectric material, silicon oxide, silicon nitride, and/or a thick oxide. Underlying ground plane substrate 60 (or D in FIG. 1) is also preferably formed using well-known CMOS techniques, is electrically conductive, and in one embodiment is formed of a semiconductor dielectric material such as silicon.

Note that the invention is not restricted to CMOS techniques. Instead, other techniques are also contemplated and included in the scope of the invention such as Bipolar-CMOS processes, combined Bipolar-CMOS-DMOS (BCD) processes, and indeed any other suitable semiconductor fabrication technique that may be employed to form the co-planar electrodes 40 and 50, insulative layer 70, and ground plane substrate 60. Note also that devices 5 and 10 of the present invention may be encapsulated at least partially in polyimide, plastic or any other suitable packaging or molding material.

Figure 3:
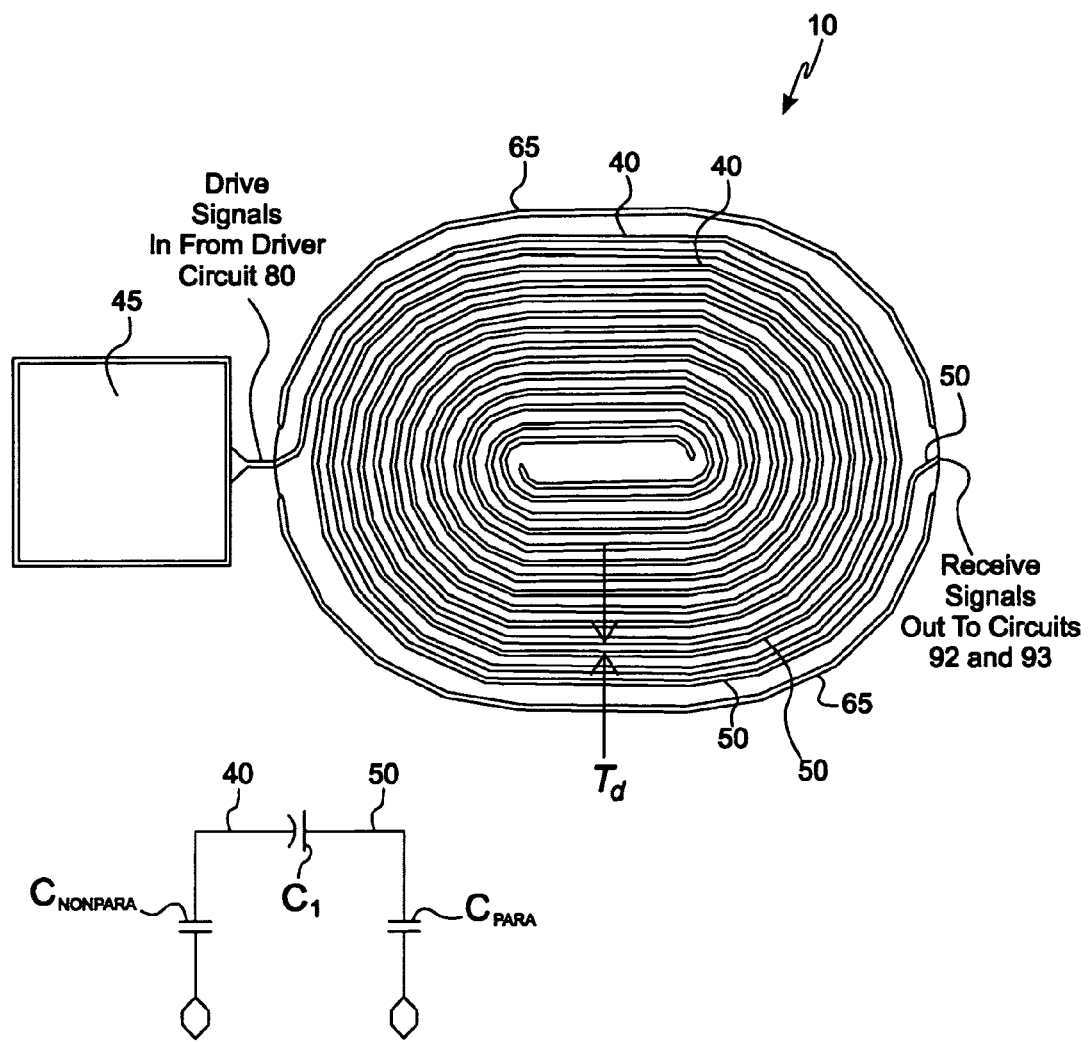
FIG. 3 shows one embodiment of a spirally wound electrode high voltage isolation semiconductor communication device.

Referring now to FIG. 3, there is shown one embodiment of a spirally wound electrode high voltage isolation co-planar horizontal capacitor structure 10, where drive electrode 40 is spirally wound around corresponding sense electrode 50, and drive electrode 40 is electrically connected to pad 45 (which in turn is connected to driver circuit 80, not shown in FIG. 3). High voltage isolation shield 65 surrounds and provides some degree of EMI protection for spirally wound electrodes 40 and 50, and further serves to protect or shield other electronic components or devices from the electrical fields generated by horizontal capacitor structure 10. Note that two or more horizontal capacitor structures 10 can be utilized in a single package or chip 5 so that fully differential communication signals can be transmitted by driver circuit 80 and received by receiver circuit 90 (not shown in FIG. 3), and so that common mode rejection ("CMR") of undesired noise and artifacts can be maximized. As in the embodiment illustrated in FIG. 2, conventional CMOS techniques are most advantageously employed to form spirally wound electrode high voltage isolation co-planar horizontal capacitor structure 10 of FIG. 3.

Figure 4:
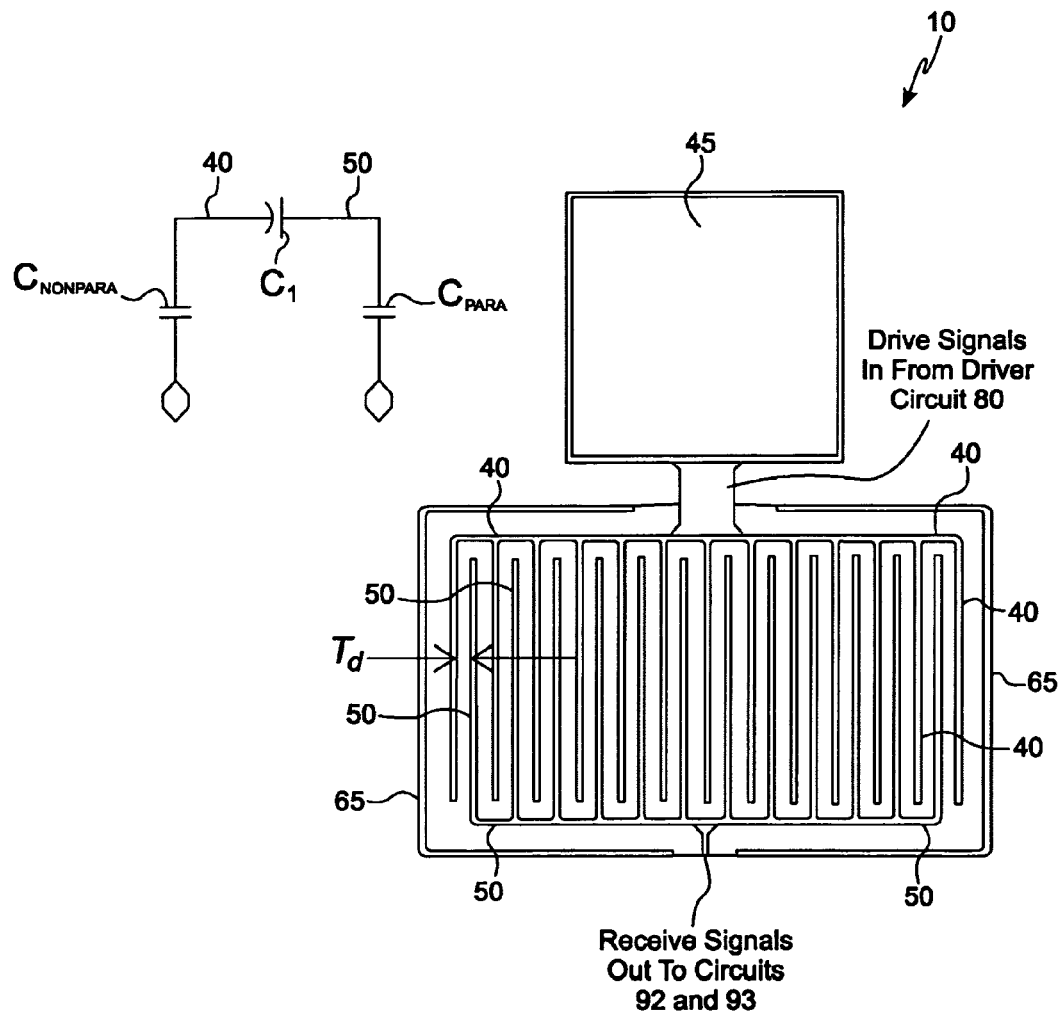
FIG. 4 shows another embodiment of a high voltage isolation semiconductor communication device with interleaved drive and sense electrodes.

Referring now to FIG. 4, there is shown one embodiment of a interleaved electrode high voltage isolation co-planar horizontal capacitor structure 10, where drive electrode 40 has fingers interleaved with corresponding fingers of sense electrode 50. Drive electrode 40 is electrically connected to pad 45 (which in turn is connected to driver circuit 80, not shown in FIG. 4). High voltage isolation shield 65 surrounds and provides some degree of EMI protection for interleaved electrodes 40 and 50, and further serves to protect or shield other electronic components or devices from the electrical fields generated by structure 10. Note that two or more devices 10 can be utilized in a single package or chip 5 so that fully differential communication signals can be transmitted by driver circuit 80 and received by receiver circuit 90 (not shown in FIG. 4), and so that common mode rejection ("CMR") of undesired noise and artifacts can be maximized. As in the embodiment illustrated in FIG. 2, conventional CMOS techniques are most advantageously employed to form interleaved electrode high voltage isolation co-planar horizontal capacitor structure 10 of FIG. 4. Note further that horizontal capacitor structure 10 of FIG. 4 includes a plurality of drive electrodes 40 interleaved with a plurality of sense electrodes 50, although the respective electrodes are connected electrically in parallel with one another.

Figure 5:
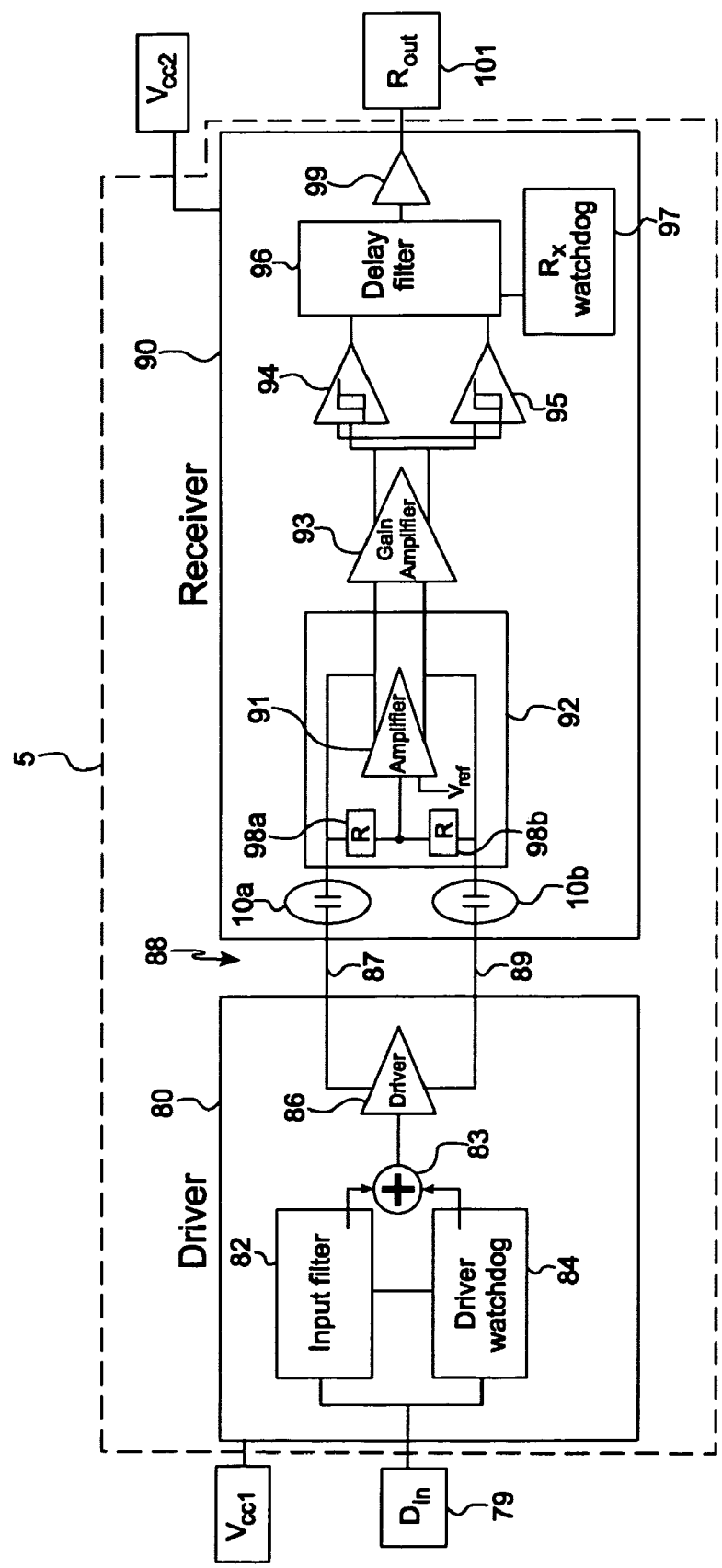
FIG. 5 shows one embodiment of a functional block diagram for driver and receiver circuits in a high voltage isolation semiconductor communication device.

FIG. 5 shows one embodiment of a functional block diagram for driver and receiver circuits 80 and 90 in high voltage isolation semiconductor communication device 5. In FIG. 5, input communication signals are provided to input $D_{in}$ 79 of driver circuit 80, where they are filtered by input filter circuit 82, summed according to an output provided by driver watchdog 84, and transmitted across boundary 88 through wirebonds 87 and 89 to horizontal capacitor structures 10a and 10b. Driver circuit 86 effects the transmission of communication signals across boundary 88 to receiver circuit 90. The output provided by CMR circuit 92 is routed to gain amplifier circuit 93, which provides outputs to comparator/RS flip-flops 94 and 95, whose outputs in turn are routed to delay filter circuit 96. A final output signal from receiver circuit 90 is provided by output buffer 99 at $R_{out}$ 101.

In the embodiment shown in FIG. 5, driver circuit 80 and receiver circuit 90 operate in a fully differential configuration, which has the advantage of rejecting undesirable common mode signals such as noise that may be present in the signal path. The embodiment shown in FIG. 5 achieves high common mode rejection performance. Input signals originating at driver circuit 80 are transmitted across isolation boundary 88 (which from a functional perspective includes electrically insulative material disposed between adjoining drive and sense electrodes, not shown explicitly in FIG. 5) as signal transitions, which in a preferred embodiment are transmitted fully differentially and decoded by receiver circuit 90. Fully differential signals received by sense electrodes in horizontal capacitor structures 10a and 10b are routed through common mode rejection ("CMR") circuit 92 through CMR resistors 98a and 98b. In the embodiment illustrated in FIG. 5, CMR circuit 92 regulates the common mode level of the fully differential inputs from horizontal capacitor structures 10a and 10b. Note, however, that the invention includes within its scope embodiments not having CMR circuit 92 or not having fully differential inputs provided thereto.

Some embodiments feature only one pair of isolated co-planar horizontal capacitor structures 10 to transmit and receive digital communication data, as well as to maintain signal transfer between drive and sense electrodes 40 and 50, and do not require a separate data refresh capacitor circuit. Receiver circuit 90 shown in FIG. 5 may also be configured to correctly decode signals received from driver circuit 80 and provide faithfully and highly accurately reproduced versions of input signals provided to input 79 at output 101.

Figure 6:
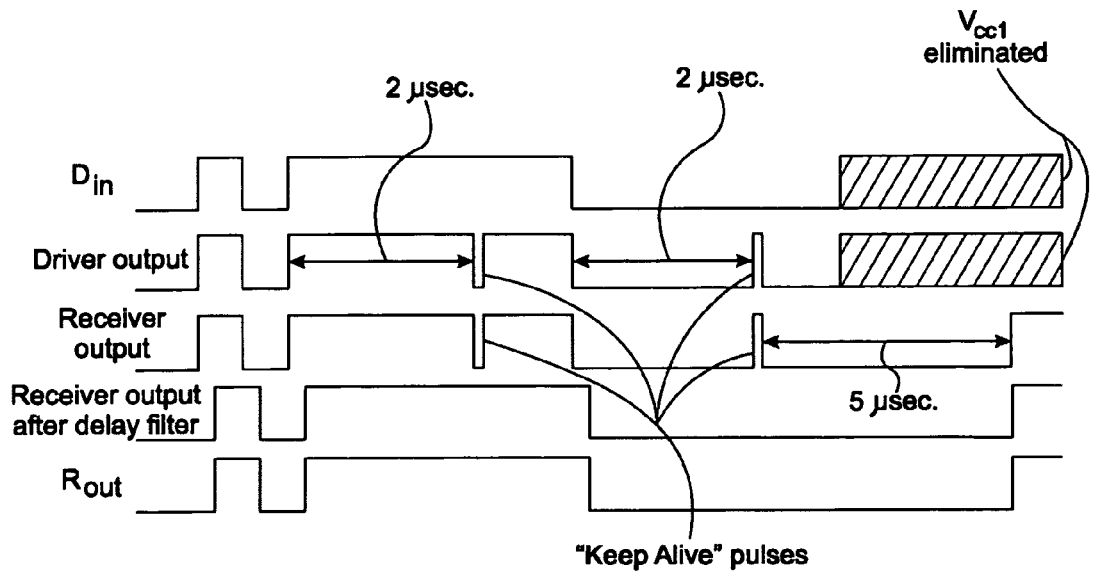
FIG. 6 shows waveforms produced by the circuits of FIG. 5 when a data-out signal defaults to a high state.
Figure 7:
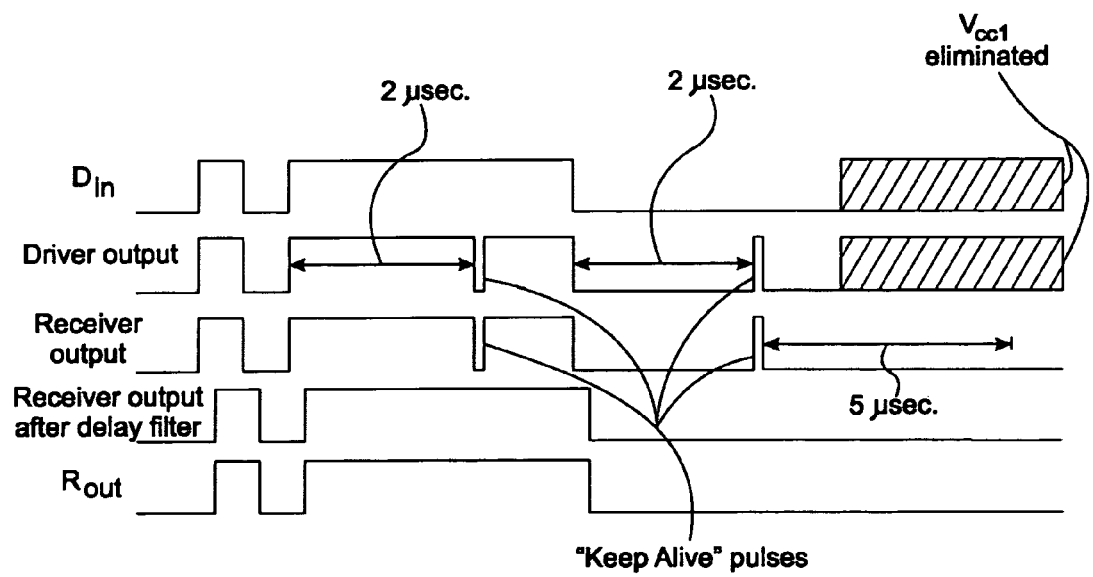
FIG. 7 shows waveforms produced by the circuits of FIG. 5 when a data-out signal defaults to a low state.

FIG. 6 shows waveforms produced by circuits 80 and 90 of FIG. 5 when a data-out signal defaults to a high state, while FIG. 7 shows waveforms produced by circuits 80 and 90 of FIG. 5 when a data-out signal defaults to a low state. Referring now to FIGS. 5 through 7, output comparator/RS flip-flops 94 and 95 are set and reset according to outputs provided by circuit 93. Driver circuit 86 is operably connected to driver watchdog circuit 84, which is configured to transmit pulses to receiver circuit 90 to maintain signals transmitted across boundary 88, which properly maintains the DC state of receiver circuit 90 in respect of signals received thereby. In the embodiment illustrated in FIG. 5, if a DC state in receiver circuit 90 is to be maintained longer than about 2 μsec. a "keep alive" pulse is transmitted from driver watchdog circuit 84 of driver circuit 80 to receiver circuit 90. As illustrated in FIGS. 6 and 7, the output provided by receiver circuit 90 at $R_{out}$ 101 defaults to a high or a low state after 5 μsec. when driver circuit 80 is no longer powered up and in consequence "keep alive" pulses are no longer received by receiver circuit 90 from driver circuit 80.

Continuing to refer to FIGS. 5 through 7, it will be seen that the transmit function of driver circuit 80 is effected by input filter circuit 82, summation block circuit 83, driver watchdog circuit 84 and single-to-differential driver circuit 86. Input filter circuit 82 is employed to ensure a pulse having a minimum width of 3 nanoseconds is filtered so as not to confuse the state machine of receiver circuit 90. The single ended to differential conversion effected by driver circuit 86 is preferably implemented with minimal skew. In addition to sending "keep alive" pulses to receiver circuit 90, driver watchdog circuit 84 may also be employed to monitor incoming data signals.

Data transmitted across boundary 88 from driver circuit 80 are differentiated when received by gain amplifier 93. Differentiation occurs due to the transmission and reception characteristics of drive and sense electrodes 40 and 50 in horizontal capacitor structures 10a and 10b, as well as those of receiver common mode resistors 98a and 98b. The amplitudes of signals initially received by receiver circuit 90 are set by the ratios of coupling capacitors $C_1$ in horizontal capacitor structures 10a and 10b, and the respective parasitic capacitances ($C_{para}$) associated therewith. The receiver circuit's input common mode is established by CMR circuit 92. In normal operation, CMR circuit 92 drives zero current into common mode resistors 98a and 98b. During a CMR event, large common mode currents are pushed or pulled into the output terminals of amplifier 91. Large dV/dT currents are created by coupling capacitors $C_1$ in conjunction with changing ground potential differences arising between driver circuit 80 and receiver circuit 90, which in a preferred embodiment each comprise separate integrated circuits (ICs). To maintain a proper common mode voltage at the input terminals of amplifier 91, CMR circuit 92 must apply a compensating current to CMR resistors 98a and 98b.

Note that without CMR circuit 92, some CMR events would drive the voltage at the sense electrodes of the receiver circuit 90 to ground or $V_{DD}$. In such a scenario, the sense electrodes would be clamped by diodes, for example, connected to the backsides of coupling capacitors $C_1$. The clamped inputs would result in all data being lost.

In one embodiment, CMR circuit 92 is designed to compensate for CMR events characterized by values less than or equal to 25 kV/μsec., which may be accomplished by forcing current into or away from the receiver inputs. As a result, receiver circuit 90 may be configured to recover data in the presence of CMR events which do not exceed 25 kV/μsec. CMR events that exceed such a threshold may result in data loss or errors. In some embodiments, data communication rates achieved by device 10, where digital data are transferred by capacitive means between driver circuit 80 and receiver circuit 90, may range up to or even exceed about 300 Megabits per second.

It will now become apparent to those skilled in the art that the various embodiments of the invention disclosed herein provide several advantages, including, but not limited to providing improved circuit performance, smaller packages or chips, lower power consumption, and faster data transmission rates.

Note that the terms "vertical" and "horizontal" employed herein are intended to refer to the relative orientations of capacitor planes as they relate to underlying or overlying ground plane substrates 60. Thus, while a device made in accordance with the teachings of the invention might, in fact, have co-planar digital data communication electrodes disposed in a single plane, and the single plane is vertically oriented but is parallel or substantially parallel to the ground plane substrate, such a device would nevertheless fall within the scope of the invention.

Note further that included within the scope of the present invention are methods of making and having made the various components, devices and systems described herein.

The above-described embodiments should be considered as examples of the present invention, rather than as limiting the scope of the invention. In addition to the foregoing embodiments of the invention, review of the detailed description and accompanying drawings will show that there are other embodiments of the invention. Accordingly, many combinations, permutations, variations and modifications of the foregoing embodiments of the invention not set forth explicitly herein will nevertheless fall within the scope of the invention.

We claim:

1. A high voltage isolation semiconductor digital communication device, comprising:
    at least one communication drive electrode comprising a drive input and opposing substantially vertical sidewalls having a height of about $T_n$, the drive electrode further being formed of a first electrically conductive metal, metal alloy or metal mixture;
    at least one communication sense electrode comprising a sense output and opposing substantially vertical sidewalls having the height of about $T_n$, the sense electrode being formed of a second electrically conductive metal, metal alloy or metal mixture;
    an electrically conductive ground plane substrate spaced apart from the drive and sense electrodes by an electrically insulative layer having a thickness d;
    a drive circuit operably coupled to the drive input and configured to transmit a communication drive signal therethrough, and
    a receive circuit operably coupled to the sense output and configured to receive the communication drive signal transmitted between the sense and drive electrodes;
    wherein the drive and sense communication electrodes are disposed substantially in a single plane and are operably configured and associated in respect of one another to effect the transfer of digital communication signals therebetween by capacitive means, the sidewall heights $T_n$ exceed about 1 micron thereby to decrease electrical field densities associated therewith, the sense and drive electrodes are separated by an inter-electrode spacing $T_d$ exceeding about 1 micron, the inter-electrode spacing $T_d$ is greater than or equal to the thickness d, and a first breakdown voltage between the drive electrode and the sense electrode exceeds about 2,000 volts RMS when applied over a time period of about one minute.

2. The device of claim 1, wherein the first breakdown voltage exceeds about 2,500 volts RMS when applied over a time period of about one minute.

3. The device of claim 1, wherein the first breakdown voltage exceeds about 3,000 volts RMS when applied over a time period of about one minute.

4. The device of claim 1, wherein the first breakdown voltage is greater than or equal to a second breakdown voltage between the drive electrode and the ground plane substrate.

5. The device of claim 1, wherein the inter-electrode spacing $T_d$ is about 1.5 times greater than the thickness d of the electrically insulative layer.

6. The device of claim 1, wherein the inter-electrode spacing $T_d$ is about 2.0 times greater than the thickness d of the electrically insulative layer.

7. The device of claim 1, wherein the sidewall heights $T_n$ range between about 1 micron and about 6 microns.

8. The device of claim 1, wherein the sidewall heights $T_n$ range between about 1 micron and about 3 microns.

9. The device of claim 1, wherein the inter-electrode spacing $T_d$ ranges between about 1 micron and about 15 microns.

10. The device of claim 1, wherein the first and second metals, metal alloys or metal combinations are substantially the same.

11. The device of claim 1, wherein the first and second metals, metal alloys or metal combinations comprise one or more of gold, silver, copper, tungsten, tin, aluminium, and aluminium-copper.

12. The device of claim 1, wherein the electrically insulative layer comprises one or more of a semiconductor dielectric material, silicon oxide, silicon nitride and thick oxide.

13. The device of claim 1, wherein the electrically conductive ground plane substrate is formed of a semiconductor dielectric material or silicon.

14. The device of claim 1, wherein the sense and drive electrodes are separated by at least one electrically insulative material disposed therebetween.

15. The device of claim 1, wherein the at least one drive electrode comprises a plurality of drive electrodes.

16. The device of claim 1, wherein the at least one sense electrode comprises a plurality of sense electrodes.

17. The device of claim 1, wherein the drive and sense electrodes are interleaved with one another.

18. The device of claim 1, wherein the drive and sense electrodes are spirally wound.

19. The device of claim 1, wherein the electric field densities do not exceed about 400 volts/micron when a voltage placed across the sense and drive electrode ranges between about 2,000 volts RMS and about 3,000 volts RMS.

20. The device of claim 1, wherein the drive and sense electrodes, the electrically insulative layer, and the ground plane substrate are fabricated using one or more of a CMOS process, a Bipolar-CMOS process, and a combined Bipolar-CMOS-DMOS (BCD) process.

21. The device of claim 1, wherein the device is encapsulated at least partially in polyimide or plastic.

22. The device of claim 1, wherein the drive and receive circuits are incorporated into an integrated circuit.

23. The device of claim 1, wherein the receive circuit further comprises a common mode rejection (CMR) circuit.

24. The device of claim 1, wherein the device is configured to transfer data between the drive and receive circuits at a rate of up to about 300 Megabits per second.

25. The device of claim 14, wherein the electrically insulative material comprises one or more of a semiconductor dielectric material, silicon oxide, silicon nitride and thick oxide.

26. The device of claim 15, wherein the plurality of drive electrodes are configured to transmit differential signals therethrough.

27. The device of claim 16, wherein the plurality of sense electrodes are configured to receive differential signals therethrough.

28. A method of making a high voltage isolation semiconductor digital communication device, comprising:
   providing at least one communication drive electrode comprising a drive input and opposing substantially vertical sidewalls having a height of about $T_n$, the drive electrode further being formed of a first electrically conductive metal, metal alloy or metal mixture;
   providing at least one communication sense electrode comprising a sense output and opposing substantially vertical sidewalls having a height of about $T_n$, the sense electrode being formed of a second electrically conductive metal, metal alloy or metal mixture;
   providing an electrically conductive ground plane substrate spaced apart from the drive and sense electrodes by an electrically insulative layer having a thickness d;
   providing a drive circuit operably coupled to the drive input and configured is to transmit a communication drive signal therethrough, and
   providing a receive circuit operably coupled to the sense output and configured to receive the communication drive signal transmitted between the sense and drive electrodes;
   wherein the drive and sense communication electrodes are disposed substantially in a single plane and are operably configured and associated in respect of one another to effect the transfer of digital communication signals therebetween by capacitive means, the sidewall heights $T_n$ exceed about 1 micron thereby to decrease electrical field densities associated therewith, the sense and drive electrodes are separated by an inter-electrode spacing $T_d$ exceeding about 1 micron, the inter-electrode spacing $T_d$ is greater than or equal to the thickness d, and a first breakdown voltage between the drive electrode and the sense electrode exceeds about 2,000 volts RMS when applied over a time period of about one minute.

29. The method of claim 28, wherein the first breakdown voltage exceeds at least one of about 2,500 volts RMS when applied over a time period of about one minute, and about 3,000 volts RMS when applied over a time period of about one minute.

30. The method of claim 28, wherein the first breakdown voltage is greater than or equal to a second breakdown voltage between the drive electrode and the ground plane substrate.

31. The method of claim 28, wherein the inter-electrode spacing $T_d$ is at least one of about 1.5 times greater than the thickness d of the electrically insulative layer and about 2.0 times greater than the thickness d of the electrically insulative layer.

32. The method of claim 28, wherein the sidewall height $T_n$ ranges between about 1 micron and about 6 microns, or between about 1 micron and about 3 microns.

33. The method of claim 32, wherein the inter-electrode spacing $T_d$ ranges between about 1 micron and about 15 microns.

* * * * *